(12) United States Patent
Usui (10) Patent No.: US 10,018,910 B2
(45) Date of Patent: Jul. 10, 2018

(54) IMPRINT APPARATUS, ALIGNMENT METHOD, AND METHOD OF MANUFACTURING ARTICLE

(71) Applicant: CANON KABUSHIKI KAISHA, Tokyo (JP)

(72) Inventor: Yoshiyuki Usui, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 242 days.

(21) Appl. No.: 14/636,431

(22) Filed: Mar. 3, 2015

(65) Prior Publication Data

US 2015/0251348 A1 Sep. 10, 2015

(30) Foreign Application Priority Data

Mar. 10, 2014 (JP) .................. 2014-046753

(51) Int. Cl.
B29C 59/02 (2006.01)
G03F 7/00 (2006.01)

(52) U.S. Cl.
CPC .................. *G03F 7/0002* (2013.01)

(58) Field of Classification Search
CPC ...... B29C 59/002; B29C 59/02; G03F 7/0002
See application file for complete search history.

(56) References Cited

U.S. PATENT DOCUMENTS

| 8,691,124 B2 | 4/2014 | Wuister et al. |
| 8,740,604 B2 | 6/2014 | Sato |
| 2013/0015597 A1 | 1/2013 | Hattori |

FOREIGN PATENT DOCUMENTS

| JP | H06013282 A | 1/1994 |
| JP | H06267815 A | 9/1994 |
| JP | H08250399 A | 9/1996 |
| JP | 09244265 A | 9/1997 |
| JP | H09320920 A | 12/1997 |
| JP | H1152583 A | 2/1999 |
| JP | 2000241995 A | 9/2000 |
| JP | 2001332478 A | 11/2001 |
| JP | 4185941 B2 | 11/2008 |
| JP | 2013026288 A | 2/2013 |
| JP | 2013511826 A | 4/2013 |

(Continued)

OTHER PUBLICATIONS

Office Action issued in Korean Patent Application No. 10-2015-0028918, dated Nov. 2, 2016.

(Continued)

*Primary Examiner* — James Sanders
(74) *Attorney, Agent, or Firm* — Rossi, Kimms & McDowell LLP (57) ABSTRACT

The present invention provides an imprint apparatus which forms a pattern in an imprint material on a substrate using a mold, the apparatus including a stage configured to hold the substrate, a holding mechanism configured to hold the mold, a scope configured to detect a mark provided on the mold, a driving mechanism configured to drive the scope to locate the mark provided on the mold within a field of view of the scope, and a processing unit configured obtain a positional shift amount from a reference position of the mold held by the holding mechanism based on a driving amount of the scope required for positioning the scope, and perform alignment between the mold and the substrate based on the positional shift amount.

19 Claims, 4 Drawing Sheets

(56) References Cited

FOREIGN PATENT DOCUMENTS

| JP | 2013197107 A | 9/2013 |
|---|---|---|
| JP | 2013219333 A | 10/2013 |
| KR | 1020110085888 A | 7/2011 |
| KR | 1020130009630 A | 1/2013 |

OTHER PUBLICATIONS

Office Action issued in Japanese Patent Application No. 2014-046753 dated Aug. 21, 2017.
Office Action issued in Korean Application No. 10-2015-0028918 dated Jun. 27, 2017. English translation provided.
Office Action issued in Japanese Application No. 2014-046753 dated Feb. 9, 2018.

IMPRINT APPARATUS, ALIGNMENT METHOD, AND METHOD OF MANUFACTURING ARTICLE

BACKGROUND OF THE INVENTION

Field of the Invention

The present invention relates to an imprint apparatus, an alignment method, and a method of manufacturing an article.

Description of the Related Art

An imprint technique can form a fine pattern, and is coming into practical use as one of lithography techniques for volume production of magnetic storage media and semiconductor devices. As disclosed in Japanese Patent No. 4185941, an imprint apparatus which employs the imprint technique forms a pattern on a substrate such as a silicon wafer or a glass plate using a mold (die), as an original, on which a fine pattern (unevenness) has been formed. The imprint apparatus, for example, coats the substrate with a light curable resin (for example, an ultraviolet-curing resin), and molds the resin using the mold. The resin is irradiated with light (for example, ultraviolet light) to be cured, and then the mold is separated from the cured resin, thereby forming the pattern of the resin on the substrate.

The imprint apparatus adopts the die-by-die alignment scheme or the global alignment scheme as a scheme of alignment between a substrate and a mold. In the die-by-die alignment scheme, for each of a plurality of shot regions on the substrate, an alignment mark on the substrate and an alignment mark on the mold are optically detected to correct a shift in positional relationship between the mold and the substrate. The global alignment scheme is an alignment scheme of correcting the shift in positional relationship between the mold and the substrate based on the positions of all shot regions determined by performing statistical processing on the detection result of alignment marks which have been formed in some representative sample shot regions. As an alignment scope which detects the alignment marks, a TTM (Through The Mold) scope is used in the die-by-die alignment scheme, whereas an OA (Off Axis) scope is used in the global alignment scheme.

The imprint apparatus is required to measure the position of the mold in advance. In the die-by-die alignment scheme, the alignment mark on the substrate and the alignment mark on the mold should come into the field of view of the alignment scope. To achieve this, the position of the mold needs to be obtained in advance (prealignment of the mold). The position of the mold also needs to be obtained in advance in the global alignment scheme because a positional shift in the mold when bringing the resin on the substrate and the mold into contact with each other leads to a decrease in overlay accuracy.

In the prealignment of the mold, the alignment scope first detects the alignment mark on the mold. Next, the alignment scope detects the alignment mark on the substrate or a reference mark arranged on a substrate stage while the X-Y position of the alignment scope is fixed. Then, the relative position between the alignment mark on the mold and the alignment mark on the substrate or the relative position between the reference mark and the alignment mark on the mold is obtained. Such prealignment of the mold takes much time, and thus becomes a factor to reduce the throughput of the imprint apparatus. Particularly, in the imprint apparatus, in addition to the need to change molds regularly, a shift in the alignment mark on the mold is large and thus the alignment mark on the mold easily falls outside the field of view of the alignment scope. Therefore, the prealignment of the mold has a great influence on the throughput of the imprint apparatus.

SUMMARY OF THE INVENTION

The present invention provides an imprint apparatus advantageous in terms of a time required for the alignment between a mold and a substrate.

According to one aspect of the present invention, there is provided an imprint apparatus which forms a pattern in an imprint material on a substrate using a mold, the apparatus including a stage configured to hold the substrate, a holding mechanism configured to hold the mold, a scope configured to detect a mark provided on the mold, a driving mechanism configured to drive the scope, and a processing unit configured to position the scope by the driving mechanism so that the scope detects the mark on the mold held by the holding mechanism, obtain a positional shift amount from a reference position of the mold held by the holding mechanism based on a driving amount of the scope that has been required for positioning the scope, and performs alignment between the mold and the substrate based on the positional shift amount.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
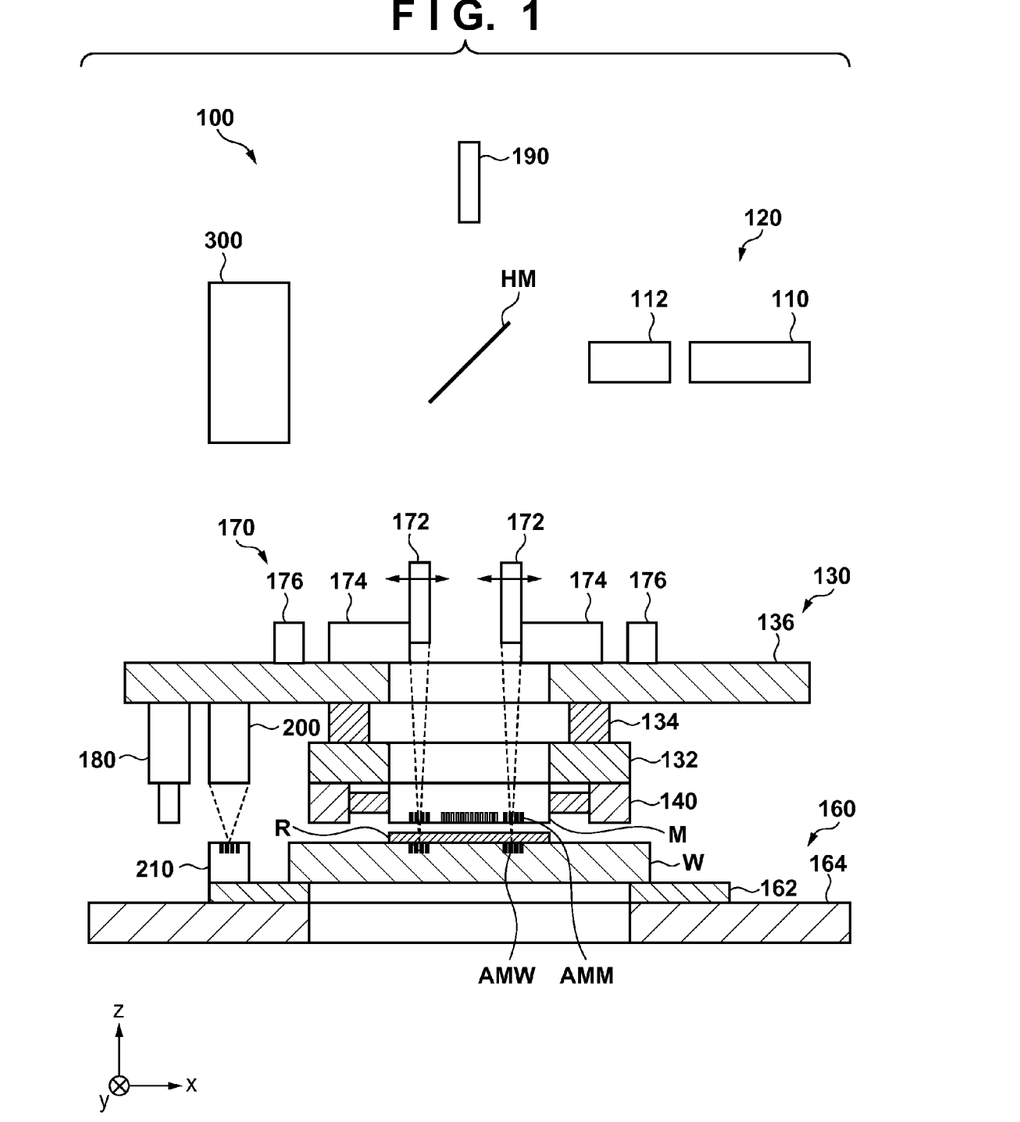
FIG. 1 is a schematic view showing the arrangement of an imprint apparatus according to an aspect of the present invention.

FIG. 1 is a schematic view showing the arrangement of an imprint apparatus 100 according to an aspect of the present invention. The imprint apparatus 100 is a lithography apparatus which molds an imprint material on a substrate using a mold and forms a pattern on the substrate. In this embodiment, the imprint apparatus 100 uses a resin as the imprint material and adopts, as a resin-curing method, a photocuring method in which the resin is cured by irradiation with ultraviolet light (UV light). However, the imprint apparatus 100 may also cure the resin by irradiation with light having another wavelength region, and may also adopt a heat-curing method in which the resin is cured by using another energy such as heat.

The imprint apparatus 100 forms patterns in a plurality of shot regions on the substrate by repeating an imprint process. Note that the imprint process is a process of transferring a pattern formed on a mold onto the substrate by curing the resin while keeping the mold and the resin on the substrate in contact with each other.

The imprint apparatus 100 includes a curing unit 120, a mold holding mechanism 130, a mold correcting mechanism 140, a substrate holding mechanism 160, an alignment mechanism 170, a coating mechanism 180, an observation optical system 190, an off-axis scope 200, and a control unit 300. The imprint apparatus 100 also includes a platen and an antivibrator (damper). The platen supports the entire imprint apparatus 100 and forms a reference plane when a substrate stage 164 moves. The antivibrator removes a vibration from a floor and supports the platen.

The curing unit 120 irradiates a resin (resist) R with light (ultraviolet light) via a mold M to cure the resin R on a substrate W. In this embodiment, the resin R is an ultraviolet-curing resin. The curing unit 120 includes a light source unit 110, an optical system 112, and a half mirror HM. The light source unit 110 includes, for example, a light source such as a halogen lamp which generates ultraviolet light (for example, an i-line or g-line), and an elliptical mirror which condenses light from the light source. The optical system 112 includes a lens and an aperture configured to irradiate a shot region on the substrate W with light for curing the resin R. The aperture is used for angle-of-view control and peripheral light-shielding control. The angle-of-view control is control for irradiating only a target shot region with light, and the peripheral light-shielding control is control for restricting the irradiation of the substrate W with light beyond its outer shape. The optical system 112 may also include an optical integrator for irradiating the mold M uniformly. Light from the optical system 112 is reflected by the half mirror HM and enters the resin R on the substrate W via the mold M.

In order to transmit ultraviolet light serving as light for curing the resin R, the mold M is made of a material such as quartz which is transparent to the wavelength of the ultraviolet light. A mold conveyance mechanism (not shown) conveys the mold M. The mold conveyance mechanism includes, for example, a conveyance robot including a chuck such as a vacuum chuck.

The mold holding mechanism 130 includes a chuck 132 which holds the mold M, a mold driving mechanism 134 which drives the chuck 132 (that is, moves the mold M), and a base 136 which supports the mold driving mechanism 134. The mold driving mechanism 134 includes a positioning mechanism which controls the position of the mold M with respect to six axes, and a mechanism which presses the mold M against the resin R on the substrate W or separates the mold M from the cured resin R. Note that six axes are an X-axis, a Y-axis, a Z-axis, and rotation axes thereof in an X-Y-Z coordinate system in which it is assumed that the holding surface (a surface on which the mold M is held) of the chuck 132 is an X-Y plane and a direction perpendicular to the X-Y plane is the Z axis.

The mold correcting mechanism 140 is arranged in the chuck 132. The mold correcting mechanism 140 corrects the shape of the mold M by pressurizing the mold M from a peripheral direction using, for example, a cylinder (an actuator) which operates by a fluid such as air or oil. Furthermore, the mold correcting mechanism 140 may include a temperature control unit which controls the temperature of the mold M and corrects the shape of the mold M by controlling the temperature of the mold M. The mold correcting mechanism 140 may also include a mechanism which corrects the shape of the substrate W by controlling the temperature of the substrate W. The substrate W is deformed (typically, expands or shrinks) after going through a process such as annealing. The mold correcting mechanism 140 corrects the shape of the mold M to cope with such deformation of the mold M such that an overlay error falls within an allowable range.

The substrate holding mechanism 160 includes a chuck 162 which holds the substrate W, the substrate stage 164 which drives the chuck 162 (that is, moves the substrate W), and a stage driving mechanism (not shown). The stage driving mechanism includes a positioning mechanism which controls the position of the substrate W by controlling the position of the substrate stage 164 with respect to six axes.

The alignment mechanism 170 includes alignment scopes 172, scope driving mechanisms 174, and detection units 176. Each alignment scope 172 includes an Automatic Adjustment Scope (AAS) which performs the alignment between the mold M and the substrate W (shot regions thereof). Each alignment scope 172 detects an alignment mark AMM provided on the mold M. Each alignment scope 172 also detects, via the mold M, an alignment mark AMW provided on the substrate W. Each alignment scope 172 can also detect a reference mark and an alignment mark which are provided in a reference plate 210 arranged on the substrate stage 164. The scope driving mechanisms 174 are arranged on the base 136. Each scope driving mechanism 174 drives the alignment scope 172 in a direction parallel to the pattern surface of the mold M, thereby positioning the alignment scope 172. Each detection unit 176 includes, for example, an interferometer and an encoder, and detects the driving amount of the alignment scope 172 driven by the scope driving mechanism 174.

Figure 4A:
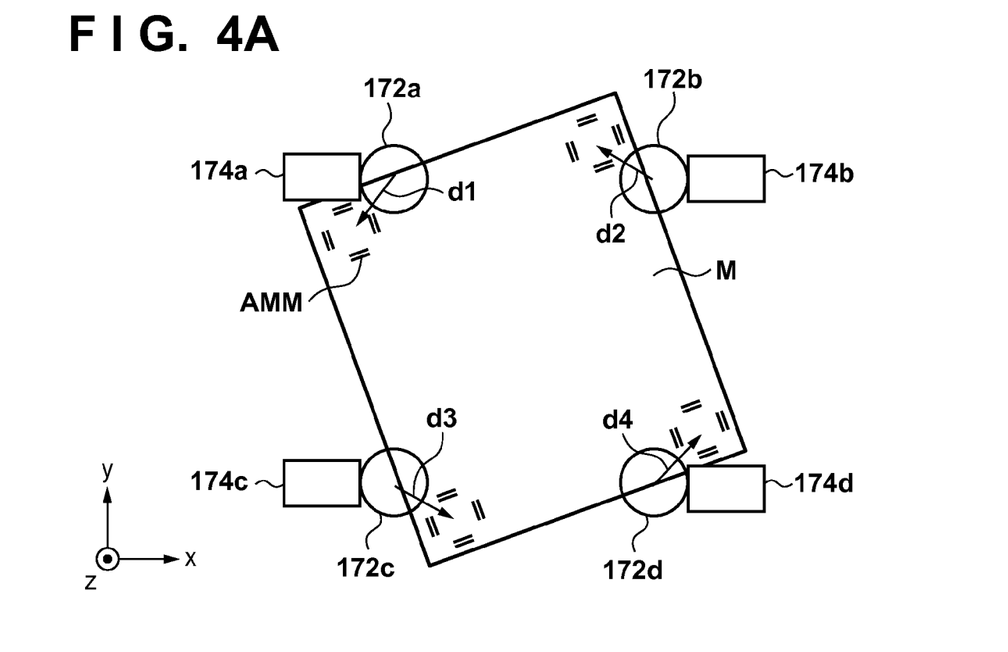
FIGS. 4A and 4B are views for explaining the driving of an alignment scope by a scope driving mechanism.

The plurality of alignment scopes 172 are provided. In this embodiment, as shown in FIG. 4A, four alignment scopes 172a, 172b, 172c, and 172d are arranged to surround the mold M. In addition, scope driving mechanisms 174a, 174b, 174c, and 174d are provided in correspondence with the alignment scopes 172a to 172d, respectively. The driving origins of the scope driving mechanisms 174a to 174d and that of the substrate stage 164 match each other in advance.

The coating mechanism 180 coats (supplies) the substrate W, or more specifically, a shot region (target shot region) which is a target of pattern formation with the resin R. The coating mechanism 180 includes, for example, a tank which accommodates the resin R, a nozzle which discharges the resin R supplied from the tank to the substrate W, a valve provided in a supply channel which connects the tank and the nozzle, and a supply control unit. The supply control unit typically controls the supply amount of the resin R to the substrate W by controlling the valve so as to coat one shot region with the resin R in one discharge operation of the nozzle.

The observation optical system 190 serves as a scope which observes the entire shot region on the substrate W. The observation optical system 190 is used to check the state of the imprint process, for example, the imprint state of the mold M and the filling state of the mold M with the resin R.

The off-axis scope 200 detects the reference mark and the alignment mark which are provided in the reference plate 210 arranged on the substrate stage 164. The off-axis scope 200 can also detect the alignment marks AMW on the substrate W.

The control unit 300 includes a CPU and a memory, and controls the entire system (operation) of the imprint apparatus 100. In this embodiment, the control unit 300 functions as a processing unit which performs the alignment between the mold M and the substrate W in the imprint process, as will be described later.

Figure 2:
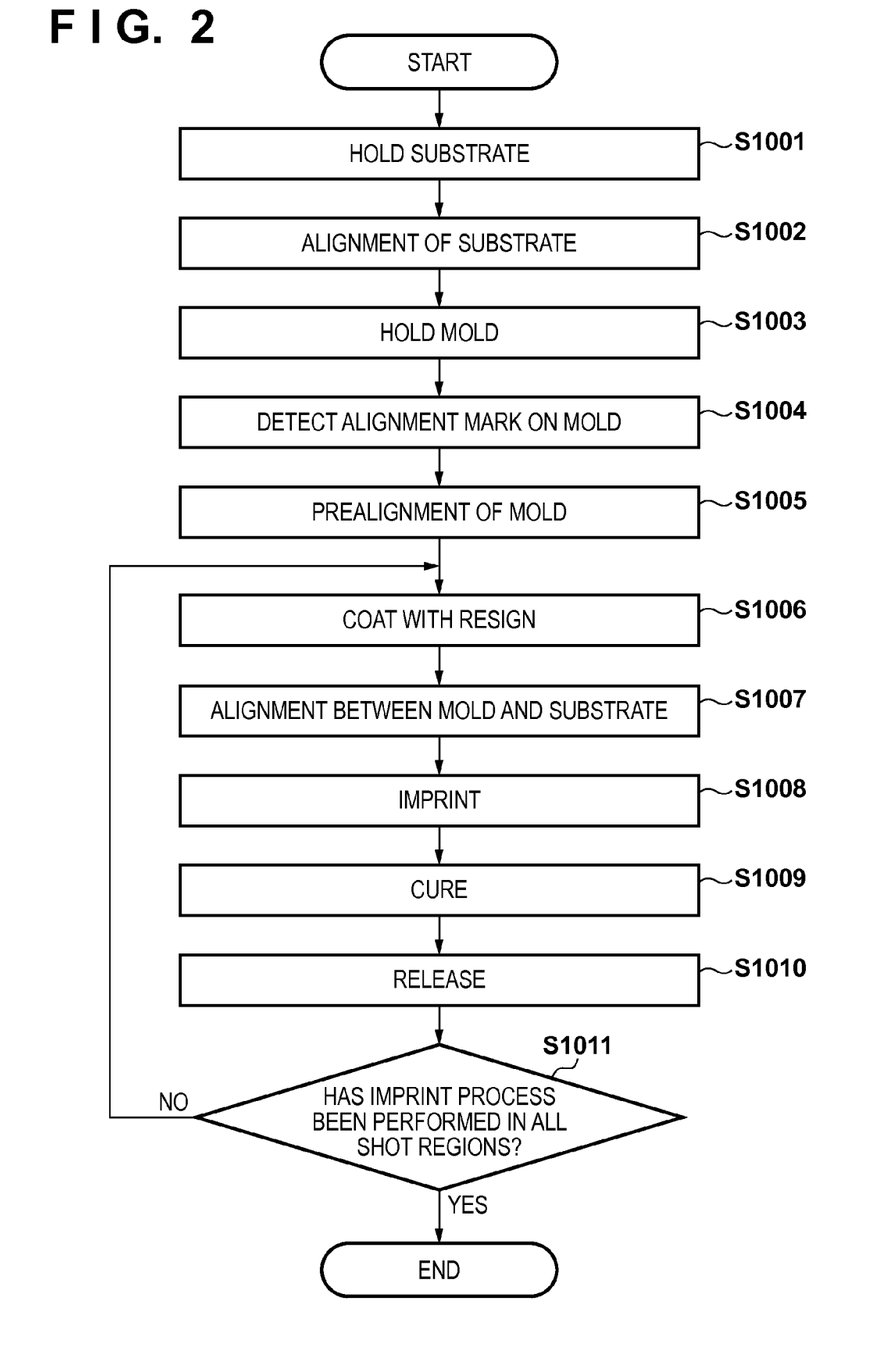
FIG. 2 is a flowchart for explaining an imprint process in the imprint apparatus shown in FIG. 1.

The imprint process in the imprint apparatus 100 will be described below with reference to FIG. 2. The control unit 300 systematically controls the respective units of the imprint apparatus 100, thereby performing the imprint process.

In step S1001, a substrate conveyance mechanism loads (conveys) the substrate W to the chuck 162, and the chuck 162 holds the conveyed substrate W. At least one alignment mark AMW is formed on the substrate W.

Figure 3A:
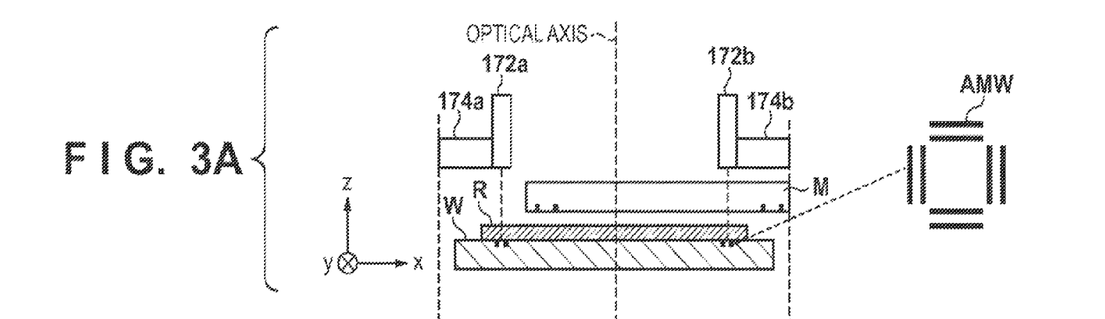
FIGS. 3A to 3C are views for explaining the imprint process in the imprint apparatus shown in FIG. 1.

In step S1002, the alignment of the substrate W held by the chuck 162 is performed. More specifically, as shown in FIG. 3A, the substrate stage 164 is moved to locate each alignment mark AMW formed on the substrate W in a position which is detectable by the corresponding alignment scope 172. In other words, the substrate stage 164 positions the substrate W to locate each alignment mark AMW within the field of view of the corresponding alignment scope 172. FIG. 3A shows a state in which the alignment of the substrate W has been performed.

In step S1003, the mold conveyance mechanism conveys the mold M to the chuck 132, and the chuck 132 holds the conveyed mold M. At this time, the mold M is positioned to the center of the chuck 132 by pressurizing the mold M from the peripheral direction. At least one alignment mark AMM is formed on the mold M.

Figure 3B:
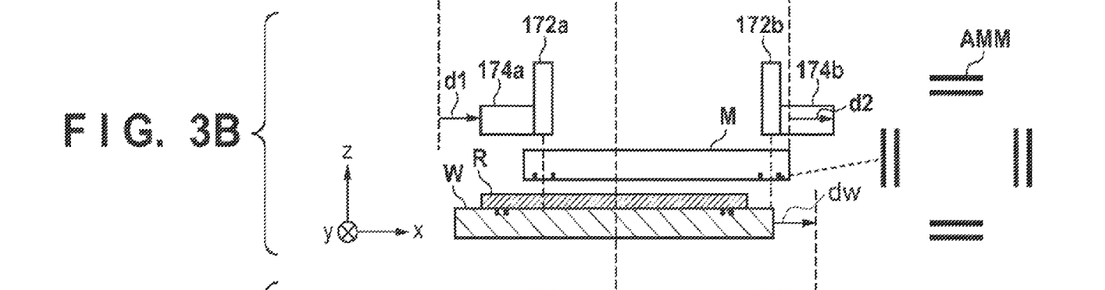

In step S1004, each alignment scope 172 detects the alignment mark AMM formed on the mold M. More specifically, as shown in FIG. 3B, the scope driving mechanism 174 positions each alignment scope 172 to locate each alignment mark AMM on the mold M held by the chuck 132 within the field of view of the corresponding alignment scope 172. Then, each alignment scope 172 thus positioned detects the alignment mark AMM on the mold M. The design position (coordinates) of each alignment mark AMM on the mold M is stored, in advance, in a storage device such as the memory of the control unit 300. Note that the pattern surface of the mold M including the alignment marks AMM includes, with respect to the periphery of the mold M, a manufacturing error of about several ten μm to several hundred μm in the X-Y direction and a manufacturing error of a rotation of about several μrad to several thousand μrad. Therefore, each alignment mark AMM may not come into the field of view of the corresponding alignment scope 172 only by driving the alignment scope 172 by the corresponding scope driving mechanism 174 to arrange it in the design position of the alignment mark AMM on the mold M. In such a case, the alignment scope 172 is positioned to locate each alignment mark AMM on the mold M within the field of view of the corresponding alignment scope 172 by repeating the driving of the alignment scope 172 by the corresponding scope driving mechanism 174.

Figure 3C:
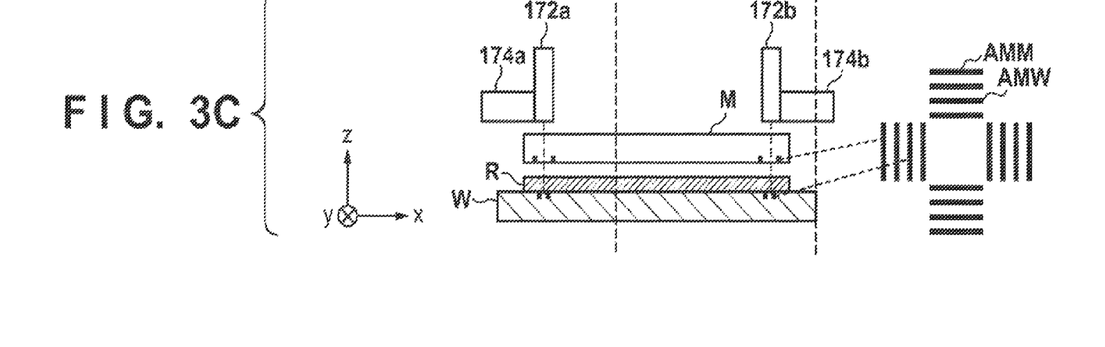
Figure 4B:
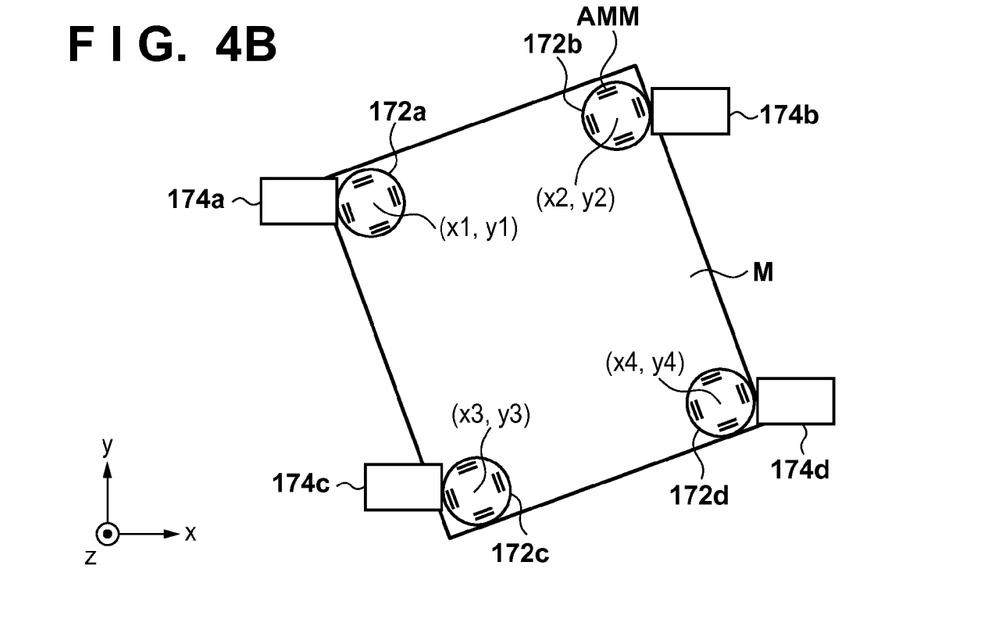

For example, from the state shown in FIG. 3A, the scope driving mechanism 174a drives the alignment scope 172a by d1, and the scope driving mechanism 174b drives the alignment scope 172b by d2. Furthermore, from a state shown in FIG. 4A, the scope driving mechanism 174c drives the alignment scope 172c by d3, and the scope driving mechanism 174d drives the alignment scope 172d by d4. This allows each of the alignment scopes 172a to 172d to detect the alignment marks AMM on the mold M, as shown in FIGS. 3B and 4B. The respective positions of the alignment scopes 172a to 172d after the driving by the scope driving mechanisms 174a to 174d are set to (x1, y1), (x2, y2), (x3, y3), and (x4, y4). FIGS. 3A to 3C show an X-Z plane of the mold M, and FIGS. 4A and 4B show the X-Y plane of the mold M.

In step S1005, the prealignment of the mold M is performed. More specifically, a positional shift amount from the reference position of the mold M is obtained based on the driving amount of each alignment scope 172 that has been required for positioning the alignment scope 172 in step S1004 and the design position of each alignment mark AMM on the mold M. In this embodiment, the reference position is the design position of each alignment mark AMM on the mold M held by the chuck 132. Note that the reference position may be the position of each alignment scope 172 when the alignment scope 172 detects the alignment mark AMW on the substrate W or the reference mark provided on the substrate stage 164.

In step S1006, the coating mechanism 180 coats the substrate W with the resin R. More specifically, the substrate stage 164 is moved to locate the target shot region on the substrate W under the coating mechanism 180. Then, the coating mechanism 180 coats (supplies) the target shot region on the substrate W with the resin R.

In step S1007, alignment between the mold M and the substrate W (the target shot regions thereof) is performed. Here, the substrate stage 164 is moved based on the result of the alignment of the substrate W in step S1002 and the result of the prealignment of the mold M in step S1005. In other words, the substrate stage 164 is moved to locate each alignment mark AMW on the substrate W within the field of view of the corresponding alignment scope 172 based on the positional shift amount from the reference position of the mold M obtained in the prealignment of the mold M. The substrate stage 164 is moved based on, for example, the correction amount obtained by correcting, with the positional shift amount from the reference position of the mold M, the moving amount of the substrate stage 164 preset to locate each alignment mark AMW on the substrate W within the field of view of the corresponding alignment scope 172. More specifically, the substrate stage 164 is moved by dw from the state shown in FIG. 3B. This makes it possible, as shown in FIG. 3C, to locate each alignment mark AMW on the substrate W within the field of view of the corresponding alignment scope 172 without moving the substrate stage 164 repeatedly (that is, in a short time). Therefore, each of the alignment scopes 172a to 172d can detect the alignment mark AMM on the mold M and the alignment mark AMW on the substrate W, and the alignment between the mold M and the substrate W can be performed.

In step S1008, the mold driving mechanism 134 moves the chuck 132 downward and presses the mold M against the resin R on the substrate W, thereby bringing the mold M and the resin R into contact with each other (imprint). Note that the mold M and the resin R may be brought into contact with each other by moving the substrate stage 164 (substrate W) upward instead of moving the chuck 132 (mold M) downward. The load obtained by pressing the mold M is controlled by using, for example, a built-in load sensor of the mold driving mechanism 134.

In step S1009, the curing unit 120 irradiates the resin R with light (ultraviolet light) via the mold M while keeping the mold M and the resin R on the substrate W in contact with each other, thereby curing the resin R on the substrate W (cure).

In step S1010, the mold driving mechanism 134 moves the chuck 132 upward, thereby releasing the mold M from the cured resin R on the substrate W. As a result, the three-dimensional shape pattern (layer) of the resin R corresponding to the pattern of the mold M is formed in the target shot region on the substrate W. Note that in step S1010, the mold M may be released from the cured resin R on the substrate W by moving the substrate stage 164 (substrate W) downward instead of moving the chuck 132 (mold M) upward.

In step S1011, it is determined whether the imprint process has been performed in all the shot regions on the substrate W. If the imprint process has not been performed in all the shot regions on the substrate W, that is, if there still remains a shot region where the imprint process has not been performed, the process advances to step S1006 to perform the imprint process in the subsequent shot region. On the other hand, if the imprint process has been performed in all the shot regions on the substrate W, the process ends.

As described above, in this embodiment, each scope driving mechanism 174 positions the alignment scope 172 to locate each alignment mark AMM on the mold M held by the chuck 132 within the field of view of the corresponding alignment scope 172. Furthermore, the positional shift amount from the reference position of the mold M is obtained based on the driving amount of each alignment scope 172 that has been required for positioning the alignment scope 172. Then, the substrate stage 164 is moved based on the positional shift amount, thereby performing the alignment between the mold M and the substrate W. This allows the imprint apparatus 100 to reduce a time required for the alignment between the mold M and the substrate W, in particular, the prealignment of the mold M significantly and suppress a decrease in a throughput due to the alignment.

In this embodiment, the alignment of the substrate W is performed by moving the substrate stage 164 to detect each alignment mark AMW on the substrate W by the corresponding alignment scope 172. Note that as with the prealignment of the mold M, the alignment of the substrate W may be performed based on the driving amount of each alignment scope 172. For example, each scope driving mechanism 174 positions the corresponding alignment scope 172 to locate each alignment mark AMW on the substrate W within the field of view of the corresponding alignment scope 172. Then, the positional shift amount from the reference position of the substrate W may be obtained from the driving amount of each alignment scope 172 that has been required for the positioning.

Furthermore, in this embodiment, the prealignment of the mold M is performed by obtaining the positional shift amount from the reference position of the mold M from the driving amount of each alignment scope 172. Note that the alignment between the alignment mark in the reference plate 210 and the alignment marks AMM on the mold M may be performed by moving the substrate stage 164 based on the positional shift amount from the reference position of the mold M after performing the prealignment of the mold M. The positional shift amount of the mold M with respect to the substrate stage 164 can be obtained by detecting, by the alignment scopes 172, the alignment mark in the reference plate 210 arranged on the substrate stage 164 and the alignment marks AMM on the mold M at the same time.

In this embodiment, the holding of the mold M (step S1003), the detection of the alignment marks AMM on the mold M (step S1004), and the prealignment of the mold M (step S1005) are performed after the holding of the substrate W (step S1001) and the alignment of the substrate W (step S1002). Note that the holding of the substrate W (step S1001) and the alignment of the substrate W (step S1002) may be performed after the holding of the mold M (step S1003), the detection of the alignment marks AMM on the mold M (step S1004), and the prealignment of the mold M (step S1005).

A method of manufacturing a device (the semiconductor device, a magnetic storage media, a liquid crystal display element, or the like) serving as an article will be described. The manufacturing method includes a step of forming the pattern on the substrate (a wafer, a glass plate, a film-like substrate, or the like) using the imprint apparatus 100. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-046753 filed Mar. 10, 2014, which is hereby incorporated by reference herein in its entirety.

What is claimed is:

1. An imprint apparatus configured to form a pattern of an imprint material on a substrate using a mold, the apparatus comprising:
    a stage configured to hold the substrate;
    a holding mechanism configured to hold the mold;
    a scope configured to detect a mark provided on the mold;
    a driving mechanism configured to drive the scope by a driving amount, prior to performing alignment between the mold and the substrate, to position the mark provided on the mold held by the holding mechanism within a field of view of the scope; and
    a processing unit configured to:
        obtain a positional shift amount from a reference position of the mold held by the holding mechanism based on the driving amount of the scope required for positioning the mark provided on the mold within the field of view of the scope; and
        control a movement amount of the stage based on the obtained positional shift amount to locate an alignment mark on the substrate within the field of view of the scope, such that the scope can detect the mark on the mold and the mark on the substrate, and alignment between the mold and the substrate can then be performed.

2. The apparatus according to claim 1, wherein the processing unit is configured to move the stage, based on the positional shift amount, to locate a mark provided on the substrate within a field of view of the scope.

3. The apparatus according to claim 2, wherein the processing unit is configured to move the stage based on a correction amount obtained by correcting, with the positional shift amount, a moving amount of the stage preset to locate the mark on the substrate within the field of view of the scope.

4. The apparatus according to claim 1, wherein the reference position includes a design position of the mark on the mold held by the holding mechanism.

5. The apparatus according to claim 1, wherein the reference position includes a position of the scope when the scope detects the mark provided on the substrate or a reference mark provided on the stage.

6. The apparatus according to claim 1, wherein the processing unit is configured to position the scope by the driving mechanism so that the mark on the mold is positioned within the field of view of the scope after detecting the mark provided on the substrate, and obtain a positional shift amount between the mold and the substrate based on a driving amount of the scope required for positioning the scope by the driving mechanism.

7. The apparatus according to claim 1, wherein the scope includes a plurality of scopes configured to detect a plurality of marks, respectively, provided on the mold.

8. The apparatus according to claim 1, further comprising a detection unit configured to detect the driving amount of the scope driven by the driving mechanism.

9. An alignment method of performing alignment between a mold held by a holding mechanism and a substrate held by a stage in an imprint process of forming a pattern of an imprint material on the substrate using the mold, the method comprising:
  driving a scope by a driving amount, prior to performing alignment between the mold and the substrate, to position a mark provided on the mold held by the holding mechanism within a field of view of the scope so that the scope detects the mark provided on the mold;
  obtaining a positional shift amount from a reference position of the mold held by the holding mechanism based on the driving amount of the scope required for positioning the mark provided on the mold held by the holding mechanism within the field of view of the scope; and
  controlling a movement amount of the stage based on the obtained positional shift amount to locate an alignment mark on the substrate within the field of view of the scope, such that the scope can detect the mark on the mold and the mark on the substrate, and alignment between the mold and the substrate can then be performed.

10. A method of manufacturing an article, the method comprising:
  forming a pattern on a substrate using an imprint apparatus; and
  processing the substrate on which the pattern has been formed,
  wherein the imprint apparatus forms the pattern of an imprint material on the substrate using a mold, and includes:
    a stage configured to hold the substrate;
    a holding mechanism configured to hold the mold;
    a scope configured to detect a mark provided on the mold;
    a driving mechanism configured to drive the scope by a driving amount, prior to performing alignment between the mold and the substrate, to position the mark provided on the mold held by the holding mechanism within a field of view of the scope; and
    a processing unit configured to:
      obtain a positional shift amount from a reference position of the mold held by the holding mechanism based on the driving amount of the scope required for positioning the mark provided on the mold within the field of view of the scope; and
      control a movement amount of the stage based on the obtained positional shift amount to locate an alignment mark on the substrate within the field of view of the scope, such that the scope can detect the mark on the mold and the mark on the substrate, and alignment between the mold and the substrate can then be performed.

11. An imprint apparatus configured to form a pattern of an imprint material on a substrate using a mold, the apparatus comprising:
  a stage configured to hold the substrate;
  a holding mechanism configured to hold the mold;
  a scope configured to detect a mark provided on the mold;
  a driving mechanism configured to drive the scope in a direction parallel to a pattern surface of the mold; and
  a processing unit configured to:
    position the scope by driving the scope using the driving mechanism, prior to performing alignment between the mold and the substrate, by a driving amount so that the mark provided on the mold is positioned within a field of view of the scope when the mark provided on the mold held by the holding mechanism is not positioned within the field of view of the scope;
    obtain a positional shift amount from a reference position of the mold held by the holding mechanism based on the driving amount of the scope required for positioning the mark provided on the mold within the field of view of the scope; and
    move the stage, based on the obtained positional shift amount, to locate an alignment mark provided on the substrate within the field of view of the scope, such that the scope can detect the mark on the mold and the mark on the substrate, and alignment between the mold and the substrate can then be performed.

12. An imprint apparatus configured to form a pattern of an imprint material on a substrate using a mold, the apparatus comprising:
  a stage configured to hold the substrate;
  a holding mechanism configured to hold the mold
  a scope configured to detect a mark provided on the mold;
  a driving mechanism configured to drive the scope in a direction parallel to a pattern surface of the mold; and
  a processing unit configured to:
    position the scope by driving the scope using the driving mechanism, prior to performing alignment between the mold and the substrate, by a driving amount so that the mark provided on the mold is positioned within a field of view of the scope when the mark provided on the mold held by the holding mechanism is not positioned within the field of view of the scope;
    obtain a positional shift amount from a reference position of the mold held by the holding mechanism based on the driving amount of the scope required for positioning the mark provided on the mold within the field of view of the scope;
    move the stage, based on the positional shift amount, to locate a reference mark provided on the stage within the field of view of the scope, such that the scope can detect the mark on the mold and the reference mark on the stage; and
    obtain a positional shift amount between the stage and the mold based on the mark on the mold and the reference mark on the stage detected by the scope such that alignment between the mold and the substrate can then be performed.

13. A method of manufacturing an article, the method comprising:
  forming a pattern on a substrate using an imprint apparatus; and
  processing the substrate on which the pattern has been formed, wherein the imprint apparatus forms the pattern of an imprint material on the substrate using a mold, and includes:
  a stage configured to hold the substrate;
  a holding mechanism configured to hold the mold;
  a scope configured to detect a mark provided on the mold;
  a driving mechanism configured to drive the scope in a direction parallel to a pattern surface of the mold; and
  a processing unit configured to:
    position the scope by driving the scope using the driving mechanism, prior to performing alignment between the mold and the substrate, by a driving amount so that the mark provided on the mold is positioned within a field of view of the scope when the mark provided on the mold held by the holding mechanism is not positioned within the field of view of the scope;
    obtain a positional shift amount from a reference position of the mold held by the holding mechanism based on the driving amount of the scope required for positioning the mark provided on the mold within the field of view of the scope; and
    move the stage, based on the obtained positional shift amount, to locate an alignment mark provided on the substrate within the field of view of the scope, such that the scope can detect the mark on the mold and the mark on the substrate, and alignment between the mold and the substrate can then be performed.

14. A method of manufacturing an article, the method comprising:
  forming a pattern on a substrate using an imprint apparatus; and
  processing the substrate on which the pattern has been formed,
  wherein the imprint apparatus forms the pattern of an imprint material on the substrate using a mold, and includes:
    a stage configured to hold the substrate;
    a holding mechanism configured to hold the mold
    a scope configured to detect a mark provided on the mold;
    a driving mechanism configured to drive the scope in a direction parallel to a pattern surface of the mold; and
    a processing unit configured to:
      position the scope by driving the scope using the driving mechanism, prior to performing alignment between the mold and the substrate, by a driving amount so that the mark provided on the mold is positioned within a field of view of the scope when the mark provided on the mold held by the holding mechanism is not positioned within the field of view of the scope;
      obtain a positional shift amount from a reference position of the mold held by the holding mechanism based on the driving amount of the scope required for positioning the mark within the field of view of the scope;
      move the stage, based on the positional shift amount, to locate a reference mark provided on the stage within the field of view of the scope, such that the scope can detect the mark on the mold and the reference mark on the stage; and
      obtain a positional shift amount between the stage and the mold such that alignment between the mold and the substrate can then be performed.

15. An alignment method of performing alignment between a mold held by a holding mechanism and a substrate held by a stage in an imprint process of forming a pattern of an imprint material on the substrate using the mold, the method comprising:
  positioning a scope by driving the scope using a driving mechanism, in a direction parallel to a pattern surface of the mold, prior to performing alignment between the mold and the substrate, by a driving amount so that the mark provided on the mold is positioned within a field of view of the scope when the mark provided on the mold held by the holding mechanism is not positioned within the field of view of the scope;
  obtaining a positional shift amount from a reference position of the mold held by the holding mechanism based on the driving amount of the scope required for positioning the mark provided on the mold within the field of view of the scope;
  moving the stage, based on the positional shift amount, to locate a reference mark provided on the stage within the field of view of the scope, such that the scope can detect the mark on the mold and the reference mark on the stage; and
  obtaining a positional shift amount between the stage and the mold based on the mark on the mold and the reference mark on the stage detected by the scope such that alignment between the mold and the substrate can then be performed.

16. The method according to claim 15, wherein the reference position includes a design position of the mark on the mold held by the holding mechanism.

17. The method according to claim 15, wherein the reference position includes a position of the scope when the scope detects a mark provided on the substrate or the reference mark provided on the stage.

18. The method according to claim 15, wherein the scope includes a plurality of scopes configured to detect a plurality of marks, respectively, provided on the mold.

19. The method according to claim 15, further comprising detecting the driving amount of the scope driven by the driving mechanism.

* * * * *